United States Patent [19]

Farwell

[11] Patent Number: 5,329,167

[45] Date of Patent: Jul. 12, 1994

[54] TEST FLIP-FLOP WITH AN AUXILLARY LATCH ENABLING TWO (2) BITS OF STORAGE

[75] Inventor: William D. Farwell, Thousand Oaks, Calif.

[73] Assignee: Hughes Aircraft Company, Los Angeles, Calif.

[21] Appl. No.: 950,520

[22] Filed: Sep. 25, 1992

[51] Int. Cl.⁵ .................. H03K 3/037; H04B 17/00; G01R 31/00; G11C 29/00

[52] U.S. Cl. .................. 307/272.3; 307/289; 307/291; 377/73; 365/154; 365/201; 371/22.1; 371/22.3; 371/22.5

[58] Field of Search .................. 307/272.3, 289, 291; 377/73; 365/154, 201; 371/21.1, 22.3, 22.5

[56] References Cited

U.S. PATENT DOCUMENTS 4,697,279 9/1987 Baratti et al. .................. 377/73

Primary Examiner—John Zazworsky
Attorney, Agent, or Firm—L. A. Alkov; W. K. Denson-Low

[57] ABSTRACT

A scan flip-flop cell including a flip-flop, a feed-back path by which the output of the flip-flop can be controllably held, and a latch in the feedback path that allows the cell to store two bits of data simultaneously.

6 Claims, 1 Drawing Sheet

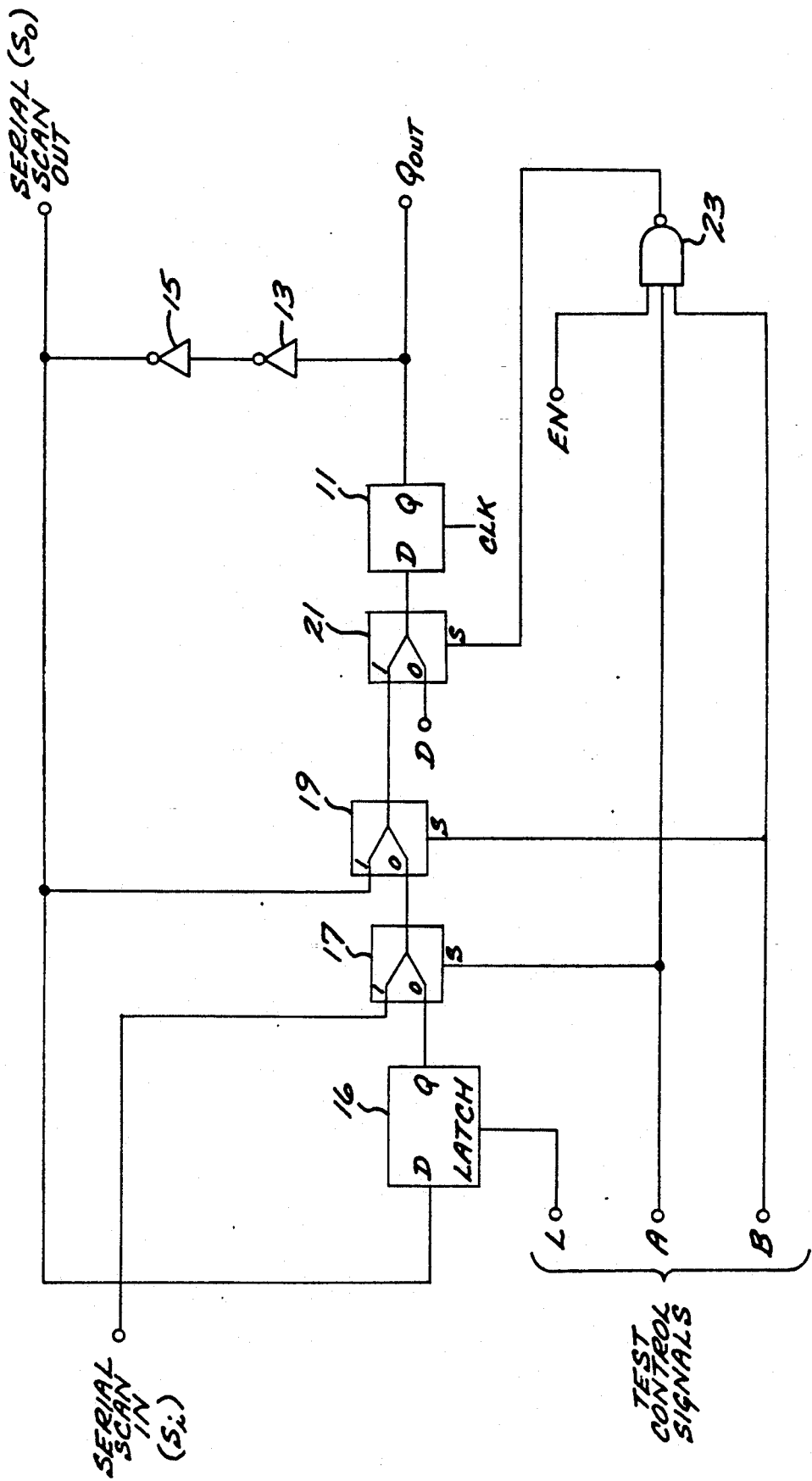

TEST FLIP-FLOP WITH AN AUXILLARY LATCH ENABLING TWO (2) BITS OF STORAGE

BACKGROUND OF THE INVENTION

The subject invention is generally directed to scan flip-flop cells, and is directed more particularly to a scan flip-flop cell that includes a feedback path by which the data output of the flip-flop cell can be held for an arbitrary amount of time, and a latch in the feedback path allowing the cell to store two bits of test data simultaneously.

Very large scale integrated circuits (VLSI circuits) often employ special circuits to aid testability so as to make the operation of testing the VLSI simpler, more efficient and more effective.

A very common built-in test circuit is the scan path or chain by which the bistable elements (flip-flops and/or latches) within a VLSI circuit are connected into a shift register called a scan path or scan chain. With the VLSI in test mode, it is possible to shift an arbitrary pattern into the bistable elements. The VLSI circuit is then operated in the normal mode for one clock period, which causes the bistable element contents to act as inputs to the internal combinational logic, and causes subsequent responses values to be stored in the bistable elements. The VLSI is again placed into test mode to allow the contents of the bistable elements to be shifted out and compared with the correct response.

While current scan path testing is effective, there are considerations with known scan circuitry including the inability to perform path delay testing (also called AC testing). Path delay testing requires that the input to combinational logic must transition from one predefined pattern (the precursor pattern) to another predefined pattern (the driving pattern). The response from the combinational logic is sampled via the bistable elements after the proper propagation time. Both precursor and driving patterns are necessary to assure that a particular path-under-test actually changes state in the manner desired. Scan path testing cannot provide two arbitrary test patterns within one clock, since the second pattern must be scanned-in with multiple clocks, and the first pattern cannot be retained until the second arrives. Several methods have been employed or proposed which would allow scan path testing to provide two successive, arbitrary test patterns within one clock time period. These have been complex, requiring multiple clocks, or very large in use of available area, or costly in terms of having more internal delay.

Another consideration of known scan circuitry is the inability to intermix in-system verification testing, which is performed to check that the VLSI circuits are not defective, with normal system operations, since scanning test patterns into the bistable elements would necessarily erase the operational data stored therein.

SUMMARY OF THE INVENTION

It would therefore be an advantage to provide scan circuitry that is capable of storing two test patterns to enable AC testing.

Another advantage would be to provide scan circuitry that is capable of storing operational data while scan testing is being done, and re-inserting the stored operational data into the bistable elements after scan testing is completed.

The foregoing and other advantages are provided by the invention in a scan flip-flop cell which includes a flip-flop having an input and an output that provides the data output of the scan flip-flop cell, a delay circuit for providing a delayed replica of the output of the flip-flop wherein the delayed replica comprises the serial scan output of the scan flip-flop cell, a latch responsive to the delayed replica of the flip-flop output for selectively latching the delayed replica pursuant to a latch control signal, a first multiplexer responsive to the serial scan input to the scan flip-flop cell and to the output of the latch for providing an output which is a replica of the serial scan input or the latch output pursuant to a first multiplexing control signal, a second multiplexer responsive to the delayed replica of the flip-flop output and to the output of the first multiplexer for providing an output which is a replica of the delayed replica of the flip-flop output or the output of the first multiplexer pursuant to a second multiplexing control signal, and a third multiplexer responsive to the data input for the scan flip-flop cell and the output of the second multiplexer for providing an output which is a replica of the data input for the scan flip-flop cell or the output of the second multiplexer pursuant to a third multiplexing control signal. The output of the third multiplexer is provided to the input of the flip-flop such that the input to the flip-flop is determined by the first, second, and third control signals.

BRIEF DESCRIPTION OF THE DRAWINGS

The advantages and features of the disclosed invention will readily be appreciated by persons skilled in the art from the following detailed description when read in conjunction with the drawing wherein:

The figure is a schematic diagram of a scan flip-flop cell in accordance with the invention.

DETAILED DESCRIPTION OF THE DISCLOSURE

In the following detailed description and in the figure of the drawing, like elements are identified with like reference numerals.

The subject invention is directed to a scan flip-flop cell having the capability of storing two test bits which can be sequentially applied to a combinational network connected to the output of the scan flip-flop cell. The scan flip-flop cell is intended to be a building block for integrated circuit scan chains respectively comprised of a plurality or set of scan flip-flop cells in accordance with the invention.

Referring now to the figure, schematically depicted therein is a scan flip-flop cell in accordance with the invention which includes a D flip-flop 11 that is clocked by a clock signal CLK and provides a Q output of the cell which is connected, for example, to a combinational logic network (not shown) of the integrated circuit in which the cell is implemented. The output of the flip-flop 11 is further provided to an inverter 13 which in turn provides its output to the input of an inverter 15. The serially connected inverters 13, 15 effectively function as a delay buffer, and the output of the inverter 15 is a buffered and delayed replica of the Q output of the flip-flop 11 which is provided as the serial scan output $S_o$ of the cell.

The buffered and delayed replica of the Q output of the flip-flop 15 as output by the inverter 15 is further provided as the input to a latch 16 and as one input to a 2-to-1 multiplexer 19 whose other input is provided by a 2-to-1 multiplexer 17. The output of the multiplexer 19 is provided as one input to a 2-to-1 multiplexer 21 whose other input receives a D signal input to the cell that is provided by a combinational logic network (not shown) of the integrated circuit in which the cell is implemented. The output of the multiplexer 21 is provided to the D input of the flip-flop 11. The inputs to the multiplexer 17 are the output of a latch 16 and a serial scan input $S_i$ of the cell which is provided by the serial scan output of a scan flip-flop cell prior in sequence in the scan chain in which the scan flip-flop cell of FIG. 1 is implemented or by the external serial input to the scan chain.

The latch 16 is controlled by a control signal L such that it is transparent and accepting new data (which is a replica of state of the Q output of the flip-flop 11) when the control signal L is 0, and is latched and holding old data when the control signal L is 1.

The multiplexer 17 is controlled by a control signal A such that its output is a replica of the output of the latch 16 when the control signal A is 0, and is a replica of the serial scan input $S_i$ when the control signal A is 1.

The multiplexer 19 is controlled by a control signal B such that its output is a replica of the output of the latch 17 when the control signal B is 0, and is a replica of the output of the inverter 15 (which is a replica of the state of the Q output of the flip-flop 11) when the control signal B is 1.

The multiplexer 21 is controlled by the output a NAND gate 23 having inputs that receive the A and B control signals and an enable signal EN. The output of the multiplexer 21 is a replica of the D signal input to the cell when the output of the NAND gate 23 is 0, and is a replica of the output of the multiplexer 19 when the output of the NAND gate 23 is 1.

In the scan cell of the figure, the signals D, EN, and $Q_{out}$ are functional signals, while the remaining signals are for test control and evaluation. In particular, when the integrated circuit containing the scan flip-flop cell of FIG. 1 is performing its processing functions and the scan flip-flop cell is in a "functional mode" (i.e., not in a test mode), the cell operates as a conventional D flip-flop with synchronous enable and wherein D, EN, and CLK are functional inputs while Q is the functional output. All other signals are utilized only in "test mode" wherein the scan capabilities of the scan flip-flop cell are being utilized for test purposes.

The following table sets forth the operation performed by the cell at a given active transition of the clock to the flip-flop 11 for the different possible states of the control signals A and B:

| B | A | Operation |
|---|---|---|
| 0 | 0 | Transfer output of latch 16 to Q output of flip-flop 11. |
| 0 | 1 | Transfer serial scan input $S_i$ to Q output of flip-flop 11. |
| 1 | 0 | Hold previous state of Q output of flip-flop 11. |
| 1 | 1 | If EN is 1, transfer D signal input to Q output of flip-flop 11 (functional or normal mode). |

It should be appreciated that either of the test control signals A, B being 0 overrides the functional enable signal EN, and that both test control signals A, B must be 1 for the functional enable signal EN to be effective. Thus, for functional or normal mode of operation wherein the input to the flip-flop 11 corresponds to the D signal input to the cell, the both control signals A, B are 1 and the enable signal EN is also 1.

In use, scan flip-flop cells in accordance with the scan-flip-flop cell shown in the figure are implemented as internal storage elements of an integrated circuit and are connected in one or more serial scan chains which can be utilized for serial scan testing such as AC testing and open path testing. For AC testing or open path testing, it is necessary to apply a predetermined pair of test vectors in immediate time sequence. That is, the second of a pair of test vectors is applied a fixed amount of time after the first vector. There can be no intervening states, as would be the case if conventional scan application of vectors were performed.

By way of illustrative example, the operations of a scan chain of commonly clocked scan flip-flop cells, each implemented as shown in the figure, are controlled as follows for AC testing of combinational logic networks that are located between the Q output of one scan flip-flop cell and the D input of another scan flip-flop cell. In this example, the states of the mode control signals A, B cause the operation commanded (as defined in the above Table) to occur on the next active transition of the clock signal CLK subsequent to their application. The latch control signal L acts immediately on the latch 16 independently of the clock signal CLK.

1. The cells are placed in the serial mode (B=0, A=1), and the second of two test vectors to be applied sequentially to the circuit under test are serially scanned into the scan cells.
2. The cells are placed in the hold mode (B=1, A=0), and the latches are opened (made transparent) by setting L=0 for one clock period. This loads the scanned second vector into the latches. While the cells remain in the hold mode, L is returned to 1, which locks the data in the latches.
3. With the second of the two vectors locked in the latches, the cells are again placed in serial mode (B=0, A=1), and the first of the two vectors to be applied sequentially to the circuit under test is serially scanned in.
4. After the last bit of the first vector is scanned in, which results in the first vector data being transferred to the Q outputs of the flip-flops, the first test vector data is held at the Q outputs of the flip-flops for a sufficient number of clock periods for the longest path under test to settle, such that the test responses of the circuit under test are settled at the D inputs of the cells. The settling time is the time made available for all logic paths to complete their transitions and settle to their final values at the D inputs to the cells. If the desired hold time of the first vector is one clock period, the cells are not placed in the hold mode. If the desired test vector hold time is more than one clock period, the cells are placed in the hold mode by setting the mode control signals B, A to the hold mode values during the clock period following the active clock transition that scanned in the last bit of the first test vector. The control signals B, A retain the values for the hold mode until after the active clock transition that precedes the active clock transition at the end of the desired test vector hold time. In terms of clock periods, for a desired settling time of N clock periods, where N is 1 or greater, the cells are placed in the hold mode for N−1 clock periods.
5. After the first test vector data at the Q outputs of the flip-flops has been held for the appropriate number of clock periods, the cells are placed in the transfer latch contents mode (B=0, A=0), such that at the next clock the latch contents are transferred to the Q outputs of the D flip-flops. In particular, the control signals B, A are changed to the transfer latch mode during the clock interval that precedes the active clock transition that is to cause the second test vector to be transferred to the Q outputs of the flip-flops. This applies the second vector to the combinational logic paths following the settled responses of the logic paths to the first vector.

6. After the active transition that transferred the latch contents to the Q outputs of the D flip-flops, the second test vector data at the Q outputs of the D flip-flops is held for a predetermined number of clock periods the corresponds to the desired path settling time, in the same manner as the first vector data was held at the Q outputs, although the desired settling time may be different. Thus, if the desired settling time allowed for the response to the second test vector is M clock periods, wherein M is one or greater, the cells need to be placed in the hold mode for M-1 clock periods, whereby the cells are not placed in the hold mode if M=1.

7. After the second test vector data has been held at the Q outputs of the flip-flops for the desired number of clock periods, the cells are placed in the functional mode (B=0, A=1) for one clock to sample or transfer the responses to the second vector of the vector set to the Q outputs of the flip-flops, which is accomplished by setting the values of the mode control signals B, A to the functional mode values during the clock interval preceding the active clock transition at the end of the M clock periods allowed for settling. Pursuant to the one clock period functional mode of operation, the responses of the combinational logic paths are transferred to the Q outputs of the flip-flops upon the active clock transition at the end of the M clock periods allowed for settling.

8. During the clock interval following the clock transition that transferred the responses to the second test to the flip-flop Q outputs, mode control signals B, A are set to the values for the serial mode such that the responses on the flip-flop Q outputs can be serially scanned out beginning with the next active clock transition. The cells remain in the serial mode as required to serially scan out the responses to the second test vector. In accordance with known set scan techniques, it should be appreciated that while the response is being scanned out, the second vector to be applied of a subsequent test vector pair can be simultaneously serially scanned in for testing in accordance with the foregoing steps.

From the foregoing, it should be appreciated that the interval of M clock periods allowed for settling of the responses to the second test vector comprises the delay test. The Q outputs of the flip-flops contained the second vector at the start of the delay test, and the Q outputs of the flip-flops will contain the appropriate responses if the logic paths transitioned and settled properly within the M clock period settling time. The Q output of the receiving scan cell for any path failing the delay test will have remained at the state defined by the second test vector. It should also be appreciated that since the allowed settling time of M clock periods is the delay test, the settling time of N clock periods to allow settling of the response to the first vector can be longer to insure settling of the logic paths in response to the first test vector.

The foregoing procedure can further be used for open circuit testing, for example by providing for a settling time for the response to the second test vector that is sufficiently large to determine that any logic path that does not provide the proper response to the second test vector is open rather than having an excessive delay.

In addition to providing the capability for AC delay testing and open circuit testing, the scan flip-flop cell of FIG. 1 provides the capability of storing existing functional logic data while conventional scan testing takes place. The functional states can be re-inserted into the flip-flops after completion of test, thereby allowing for a smooth continuation of function operation after an interruption for testing.

By way of illustrative example, the test operations of a set of commonly clocked scan flip-flop cells are controlled as follows for conventional scan testing while functional data which is normally in the flip-flops is being saved for later re-installation. In this example, the states of the mode control signals B, A cause the operation commanded (as defined in the above Table) to occur on the next active transition of the clock signal CLK subsequent to their application. The latch control signal L acts immediately on the latch 16 independently of the clock signal CLK.

1. At the time that functional operation is to be interrupted for testing, the cells are placed in the hold mode (B=1, A=0) for one clock period by setting the mode control values to the hold mode values following the active clock transition selected to be the last functional operation, and the latches are opened (made transparent) by setting L=0 for one clock period. By placing the cells in the hold mode, the Q outputs of the cells are held so that they do not change on the active clock transition following engagement of the hold mode, and the last functional data at the flip-flop Q outputs are loaded into the latches which holds such last functional data pursuant to the latch control signal returning to 1 during the clock interval following the active clock transition during which the last functional data was held by the Q outputs of the flip-flops.

2. In the same clock interval wherein the latch control signal is returned to 1 (latched), the mode control signals can be set to the values for the serial mode, such that the cells can perform one or more scan test sequences, beginning with the next active clock transition. A scan test sequence includes (a) scanning in of one complete test vector while the cells are in the serial mode (B=1, A=1), (b) optionally setting the cells to the hold mode (B=1, A=0), if necessary to provide settling time of more than one clock period through the combinational logic under test, (c) setting the mode control values to the functional mode (B=1, A=1) for one clock period so that the responses to the test vector are transferred to the Q outputs of the flip-flops on the active clock transition following the clock transition that scanned in the last bit of the test vector, and (d) setting the mode control signals to the values for the serial mode so that the responses can be scanned out, for example starting the active clock transition following the clock transition that transferred the responses to the Q outputs of the flip-flops.

3. After the scan sequence or sequences have been completed, the last functional data stored in the latches is returned to the flip flops by engaging the transfer latch data to Q mode (B=0, A=0) which allows the last functional data be transferred to the Q outputs of the flip-flops at the active clock transition following the mode change.

4. The cells may be placed in the hold mode until transition is made back to functional mode (B=1, A=1), at which time the contents of the flip-flops of the cells are exactly the state which existed prior to the start of test.

Pursuant to the capability of storing the state of the functional data at the time of interruption for test, test patterns may be applied in separate scan test sequences that are interspersed between periods of functional operation, and testing can be distributed in time during interrupts in functional activity.

As indicated previously, only conventional scan testing (not AC or open testing) can be done while functional data is being saved. AC and open testing as described previously are performed in those situations where existing data need not be saved.

In addition to providing the foregoing capabilities, the scan flip-flop cell of the invention includes the following features.

1. The control multiplexers are arranged in series to minimize the input delay path on the D input, and to maximize the delay on the serial input path. The D input to the cell is on the first multiplexer, and thus the set up time in this path is one multiplexer delay, which is the same as for a conventional scan flip-flop cell wherein the D input to the cell is provided to the flip-flop of the cell via a multiplexer. This minimum set up delay on the D input is beneficial since long logic chains are typically interposed between the scan cell Q outputs and scan cell D inputs. The longest set-up time (3 multiplexers in series) is on the serial scan input. This is beneficial to alleviate hold time and clock skew problems which are common with scan chain hook-ups, since scan connections typically have no intervening logic delays between the serial output of one flip-flop cell and the serial input of the subsequent flip-flop cell.

2. Extra buffering is added to the Q data that is provided to the feedback path and to the serial scan output $S_o$ of the cell. This relieves the loading on the Q output of the flip-flop 11, thereby increasing its speed. More importantly, the buffering adds delays to the serial scan output $S_o$, such that it transitions later than the Q output of the flip-flop. This adds more intervening delay in the serial path between the Q output of the flip-flop of one cell and the D input of the flip-flop of the subsequent cell, which helps to alleviate clock skew problems between cells.

3. The latch is in the feedback path, and thus no extra delay is introduced in the functional paths of the flip-flop (either as extra set-up time in the input path to the D input of the flip-flop or as extra delay in the path from the Q output of the flip-flop).

4. The scan flip-flop cell of the invention is totally synchronous: only the clock needs special care to maintain waveform integrity and timing edge precision. All control signals, including the latch enable (L), behave as normal synchronous data: they may have glitches and poor edge fidelity, and need only be stable at the active clock edge to obey flip-flop set-up and hold time requirements.

The foregoing has been a disclosure of a scan flip-flop cell which supports two-pattern storage during test modes. The two-pattern storage may be advantageously used for AC testing of path delays wherein the timing between the two patterns can be adjusted as can the time delay before sampling the response to the second pattern. This implementation does not increase the internal critical signal delay within the scan cell, is efficient in gate usage, and requires only a single clock. The two-pattern storage also advantageously allows for embedding system testing within system operational timelines wherein the operational state of the machine is stored while scan test is executed, with subsequent resetting of the operational state of all flip-flops after a segment of scan test is completed.

Although the foregoing has been a description and illustration of specific embodiments of the invention, various modifications and changes thereto can be made by persons skilled in the art without departing from the scope and spirit of the invention as defined by the following claims.

What is claimed is:

1. A scan flip-flop cell for receiving a serial scan input and a data input, and for providing a serial scan output and a data output, comprising:

a flip-flop having an input and an output, wherein said flip-flop output provides the data output of the scan flip-flop cell;

delay means for providing a delayed replica of the output of said flip-flop, said delayed replica comprising the serial scan output of the scan flip-flop cell;

latching means responsive to said delayed replica of the flip-flop output for selectively latching said delayed replica pursuant to a latch control signal;

first selection means responsive to the serial scan input to the scan flip-flop cell, the output of said latching means, and said delayed replica of the flip-flop output for providing an output which is a replica of (a) the serial scan input, (b) said latch output, or (c) said replica of the flip-flop output as selected by first and second control signals;

second selection means responsive to the data input for the scan flip-flop cell and the output of said first selection means for providing an output which is a replica of (a) the first selection means output or (b) the data input to the scan flip-flop cell as selected by a third control signal, the output of said second selection means being provided to the input of said flip-flop such that the input to said flip-flop is selected by said first, second, and third control signals.

2. The scan flip-flop cell of claim 1 wherein said delay means comprises first and second serially connected inverters.

3. The scan flip-flop cell of claim 2 further including gating means responsive to the first and second control signals for providing the third control signal.

4. A scan flip-flop cell for receiving a serial scan input and a data input, and for providing a serial scan output and a data output, comprising:

a flip-flop having an input and an output, wherein said flip-flop output provides the data output of the scan flip-flop cell;

delay means for providing a delayed replica of the output of said flip-flop, said delayed replica comprising the serial scan output of the scan flip-flop cell;

latching means responsive to said delayed replica of the flip-flop output for selectively latching said delayed replica pursuant to a latch control signal;

first multiplexing means responsive to the serial scan input to the scan flip-flop cell and to the output of said latching means for providing an output which is a replica of (a) the serial scan input or (b) said latch output as selected by a first multiplexing control signal;

second multiplexing means responsive to said delayed replica of the flip-flop output and to the output of said first multiplexing means for providing an output which is a replica of (a) said delayed replica of the flip-flop output or (b) the output of said first multiplexing means as selected by a second multiplexing control signal; and third multiplexing means responsive to the data input for the scan flip-flop cell and the output of said second multiplexing means for providing an output which is a replica of (a) the data input for the scan flip-flop cell or (b) the output of said second multiplexing means as selected by a third multiplexing control signal, the output of said third multiplexing means being provided to the input of said flip-flop such that the input to said flip-flop is selected by the first, second, and third control signals.

5. The scan flip-flop cell of claim 4 wherein said delay means comprises first and second serially connected inverters.

6. The scan flip-flop cell of claim 5 further including gating means responsive to the first and second multiplexing control signal for providing the third multiplexing control signal.

* * * * *